United States Patent
Bhattacharya et al.

(10) Patent No.: US 6,554,923 B2
(45) Date of Patent: Apr. 29, 2003

(54) METHOD FOR PROVIDING A LOW TEMPERATURE CURABLE GALLIUM ALLOY FOR MULTICHIP MODULE SUBSTRATES

(75) Inventors: Swapan K. Bhattacharya, Cumming, GA (US); Daniel F. Baldwin, Woodstock, GA (US)

(73) Assignee: Georgia Tech Research Corp., Atlanta, GA (US)

(*) Notice: Subject to any disclaimer, the term of this patent is extended or adjusted under 35 U.S.C. 154(b) by 0 days.

(21) Appl. No.: 09/784,691

(22) Filed: Feb. 15, 2001

(65) Prior Publication Data
US 2001/0044206 A1 Nov. 22, 2001

Related U.S. Application Data
(60) Provisional application No. 60/182,699, filed on Feb. 15, 2001.

(51) Int. Cl.[7] .................................................. C21D 3/00
(52) U.S. Cl. ........................ 148/516; 148/400; 420/555; 228/37; 438/637
(58) Field of Search .................... 148/400, 516; 420/555; 228/37; 438/637

(56) References Cited

U.S. PATENT DOCUMENTS

| | | | |
|---|---|---|---|
| 4,398,975 A | 8/1983 | Ohasawa et al. | 148/400 |
| 5,053,195 A | 10/1991 | MacKay | 420/555 |
| 5,061,442 A | 10/1991 | Ozimek | 420/526 |
| 5,225,157 A | 7/1993 | McKay | 420/525 |
| 5,427,895 A * | 6/1995 | Magnuson et al. | 430/314 |
| 5,496,619 A | 3/1996 | Itagaki et al. | 428/209 |
| 5,672,913 A | 9/1997 | Baldwin et al. | 257/737 |

OTHER PUBLICATIONS

Deshmukh et al., "Gallium Alloy Interconnects for Flip–Chip Assembly Applications," IEEE Electronic Components and Technology Conference, 1996, pp. 1143–1150.

Baldwin, Daniel F.; Deshmukh, Rajan D.; and Hau, Christine S., "Gallium Alloy Interconnects For Flip–Chip Assembly Applications." 1996 Electronic Components and Technology Conference, pp. 1143–1150.

Bhattacharya, S. K. and Baldwin, D. F., "A low temperature processable ternary gallium alloy via filling application in microelectronic packaging." Journal of Materials Science: Materials in Electronics 11 (2000), pp. 653–656.

Bhattacharya, Swapan K. and Baldwin, Daniel F., "Gallium alloy breakthrough for via–filling application." Advanced Packaging, Sep. 2000, pp. 61–64.

C. MacKay and G. Schuldt "Applications of Amalgams in Micoelectronic Bonding", Proceedings of the 7th Electronics Materials and Processing Congress, Cambridge, Massachusetts, Aug. 1992, pp. 141–147.

T. Dolbear, "Liquid metal pastes for thermal connections", Proceedings of the 7th Electronics Materials and Processing Congress, Cambridge, Massachusetts, Aug. 1992, pp. 133–139.

(List continued on next page.)

Primary Examiner—Sikyin Ip
(74) Attorney, Agent, or Firm—Thomas, Kayden, Horstemeyer & Risley (57) ABSTRACT

A system and method for providing via-hole filling for microelectronic interconnections, is disclosed. Gallium metal is melted and mixed with a measured amount of copper and nickel, thereby creating a gallium alloy. Via holes are drilled within a substrate and filled with the gallium alloy. Excess gallium alloy is removed from the substrate. The substrate, having the filled via-holes therein, is then cured within the temperature range of room temperature to approximately 200 degrees Celsius. The gallium alloy may also be used for printing interconnect lines on a board surface.

10 Claims, 7 Drawing Sheets

OTHER PUBLICATIONS

D. Baldwin, R. Deshmukh, and C. Hau, "Preparation and properties of gallium for use as microelectronic interconnect materials", The International Journal of Microcircuits and Electronic Packaging, vol. 19, No. 1, 1996, pp. 37–45.

C. MacKay, "Amalgams as alternative bonding materials", International Electronic Packaging Society Conference, San Diego, California, 1989, pp. 1244–1259.

A. Dang, I.C. Ume, and S. Bhattacharya, "A study on warpage of flexible SS substrates for large area MCM–D packaging", ASME J. Electronic Packaging, vol. 122, Jun. 2000, pp. 87–91.

A. Dang, I.C. Ume, and S. Bhattacharya, "Measurement of Dynamic warpage During Thermal Cycling of Dielectric Coated SS Substrates", ASME J. Electronic Packaging, vol. 122, Jun. 2000, pp. 77–85.

Swapan K. Bhattacharya, I. Charles Ume, and Daniel F. Baldwin, "Warpage of Conductive Gallium Alloy Via–Filled Stainless Steel Substrates for Large Area Microelectronic Packaging", International Journal of Microcircuits and Electronic Packaging, vol. 23, No. 3, 2000, pp. 309–319.

Y. Polosky and I.C. Ume, "Thermoelastic Modeling of a PWB with Simulated Circuit Traces Subjected to IR Reflow Soldering with Experimental Validation", ASME J. Electronic Packaging, vol. 121, No. 4, pp. 263–270, 1999.

Y. Polosky, W. Southerlin and I.C. Ume, "A comparison of PWB warpage due to simulated infrared and wave soldering processes", IEEE, CPMT, Part C (accepted for publication), IEEE Trans. on Electronics Packaging Manufacturing, vol. 23, No.3, Jul. 2000.

T. Martin, C. Yeh and I.C. Ume, "Measuring of thermally induced warpage in printed wiring boards", Manufacturing Processes and Materials Challenges in Microelectronics Packaging, ASME Appl. Mech. Div., vol. 131, pp. 43–47, 1991.

C. Yeh, I.C. Ume, R. Fulton, K. Wyatt and J. Stafford, "Correlation of analytical and experimental approaches to determine thermally induced PWB warpage", IEEE Transactions on Components, Hybrids and Manufacturing Technology, vol. 16, pp. 986–995, 1993.

C. Yeh, K. Banerjee, T. Martin, C. Umeagukwu, J. Stafford and K. Wyatt, "Experimental and analytical investigation of thermally induced warpage for printed wiring boards", Proceedings IEEE Electronic Components Conference, Atlanta, pp. 382–387, 1991.

I. Zewi, I. Daniel and J. Gotro, "Residual stresses and warpage in circuit board composite laminates", Proceedings 1985 SEM Fall Conference on Experimental Mechanics: Transducer Technology for Physical Measurements, Grenelefe, FL, pp. 19–26, 1985.

D. Post, B. Han and P. Ifju, "High Sensitivity Moire", Springer–Verlag, New York, 1984.

S. Liu, Z Qian and C.P. Yeh, "Thermo–mechanical characterization of evolving packaging materials and structures", Proceedings of the ASME International Mechanical Engineering Congress and Exposition, Anaheim, CA, 1998.

B. Han, Y. Gui and H. Choi, "Out–of–plane displacement measurement of printed circuit board by shadow moire with variable sensitivity", Advances in Electronic Packaging, ASME EEP, vol. 4–1, pp. 179–185, 1993.

S. Bhattacharya, A. Dang, and I.C. Ume, "Warpage measurement of large area–tiled silicon substrates at various processing conditions", IEEE Transactions on Components and Packaging Technology, vol. 23, No. 3, Sep. 2000, pp. 497–569.

Y. Wang and P. Hassel, "Measurement of a Thermally Deformation of a BGA using Phase–Stepping Shadow Moire", Experimental/Numerical mechanics in Electronic Packaging, vol. 2, pp. 32–39, 1998.

Y. Wang and P. Hassel, "On–line Measurement of a Thermally Induced Warpage of a BGA with a High Sensitive Shadow Moire", International J. Microcircuit and Electronic Packaging, vol. 21, No. 2, pp. 191–196, 1998.

M.R. Stitler and I.C. Ume, "System for Real–Time Measurement of Thermally Induced PWB/PWA Warpage", ASME J. Electronic Packaging, vol. 119, pp. 1–7, Mar. 1997.

M.R. Stitler, I.C. Ume and B. Leutz, "In Process Board Warpage Measurement in a Lab Scale Wave Soldering Oven", IEEE CPMT, Part A, vol. 19, pp. 562–569, 1996.

* cited by examiner

METHOD FOR PROVIDING A LOW TEMPERATURE CURABLE GALLIUM ALLOY FOR MULTICHIP MODULE SUBSTRATES

CROSS-REFERENCES TO RELATED APPLICATIONS

This application claims the benefit of U.S. Provisional Application Number 60/182,699, filed Feb. 15, 2000, which is incorporated herein by reference in its entirety.

FIELD OF THE INVENTION

The present invention relates generally to microchip packaging, and more particularly, to a system and method for providing a ternary gallium alloy that may be used for via-hole filling and for providing interconnects for microelectronic high density packaging interconnections.

BACKGROUND OF THE INVENTION

With advancements in technology, new requirements have developed for microchip packaging. Among theses new requirements are a need for higher circuit density, fine line resolution, mixed signal circuitry, resistance to higher temperatures and resistance to severe environmental effects.

Very large-scale integrated circuits (VLSI) use multilevel circuit interconnections to provide high density and reliability in a compact structure. During fabrication, a layer of metallization is deposited on a silicon wafer and conductors are etch defined. A layer of dielectric is then deposited and windows, or via-holes, are etched through the dielectric to connect points on the metallization. The next layer of metallized conductors is then applied to form interconnections.

One of the major contributors to effective microchip packaging, and therefore responsible for satisfying the new requirements, is via-hole filling. Conductive polymer pastes are widely used as via-hole filling materials for microelectronic interconnections. Unfortunately, these polymer-based pastes have low electrical and thermal conductivity, which contributes to higher electrical via resistance. In addition, the polymer produces shrinkage voids during curing of host polymers. These shrinkage voids result in poor yield and interfacial adhesion to via-hole side walls.

Metallic amalgams have been used as interconnect material in the microelectronics packaging industry. The amalgams are mechanically alloyed mixtures of a liquid metal with other metallic powders formed at room temperature. As known in the art, the first stage of the amalgamation is the wetting of the powdered metal particles by the liquid metal and is achieved by an amalgamation process such as, but not limited to, tumbling or mixing with a mortar and pestle. The second step is the mechanical alloying process where the liquid metal penetrates through the skin of the metal particles thereby forming inter-metallic compounds. The primary processing requirements for mechanical alloying are to provide reasonably long shelf life and good fluidity to allow wetting of the bonding materials. Unfortunately, current alloy compositions have a short shelf life of only a few hours at ambient temperature before they harden.

BRIEF SUMMARY OF THE INVENTION

In light of the foregoing, the invention is a system and method for providing a gallium alloy based via-hole fill that expands during curing, resulting in better bonding to via side walls and better yields of throughhole interconnections for multi-chip module substrates.

Generally, the present invention can be viewed as providing a method for via-hole filling. In this regard, the method can be broadly summarized by the following steps: melting gallium metal; mixing the melted gallium metal with a measured amount of copper and nickel, thereby creating a gallium alloy; drilling via-holes within a substrate; filling the via-holes with gallium alloy; removing excess gallium alloy from the substrate; and curing the substrate having the filled via-holes.

The invention has numerous advantages, a few of which are delineated hereafter as examples. Note that the embodiments of the invention, which are described herein, possess one or more, but not necessarily all, of the advantages set out hereafter. One advantage of the invention is that it provides for easy printing at room temperature.

Another advantage is that it provides an improved via-hole fill that bonds to via side walls and expands with curing.

Another advantage is that it provides better yield for through hole interconnections.

Other features and advantages of the present invention will become apparent to one of reasonable skill in the art upon examination of the following drawings and detailed description. It is intended that all such additional features and advantages be included herein within the scope of the present invention as described by the claims.

DESCRIPTION OF THE PREFERRED EMBODIMENTS

Figure 1:
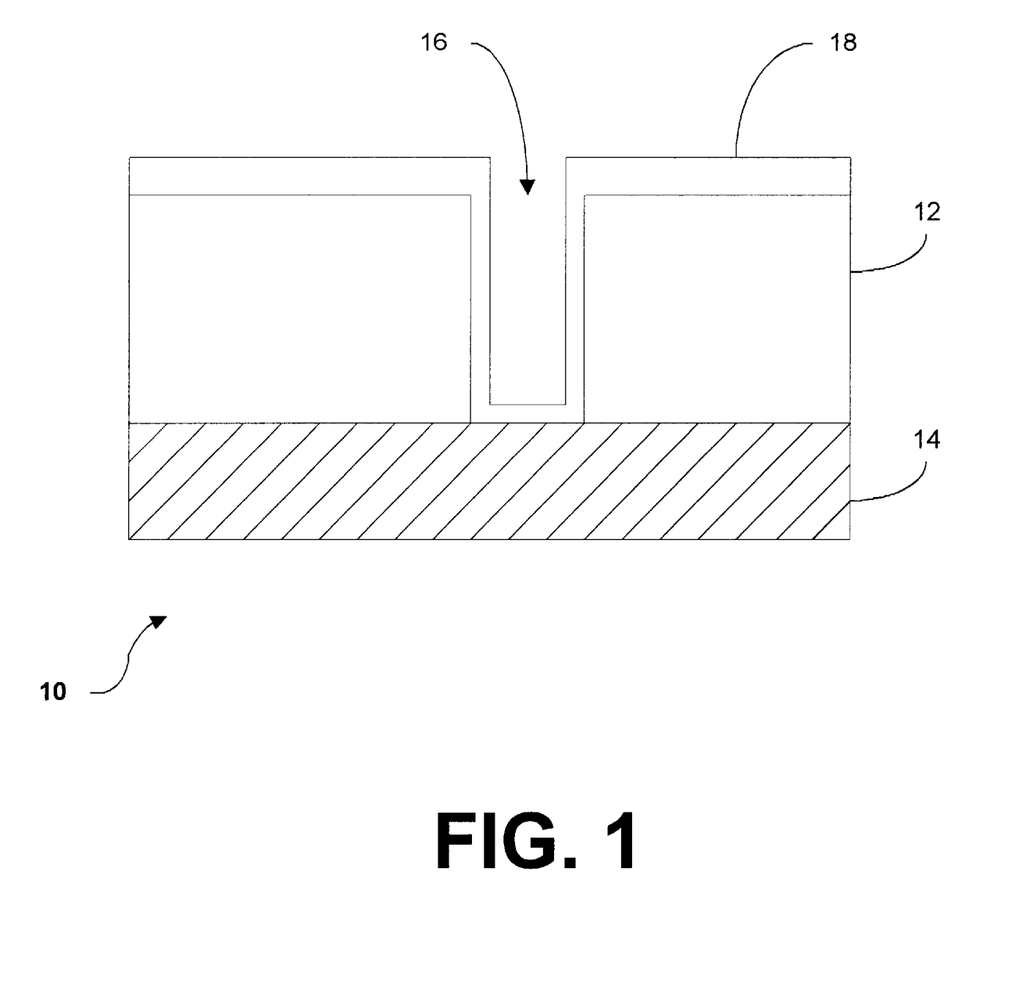
FIG. 1 illustrates interconnecting layers of an integrated circuit having a via-hole therein.

FIG. 1 is a cross-sectional view illustrating interconnecting layers of an integrated circuit 10 having a via-hole therein. As illustrated by FIG. 1, an insulating layer 12 is located on a substrate layer 14. A via-hole 16 is located within the insulating layer 12. A barrier layer 18, is provided on the insulating layer which separates the via-hole 16 from the substrate layer 14. Each of these layers are discussed in detail herein below.

Figure 2:
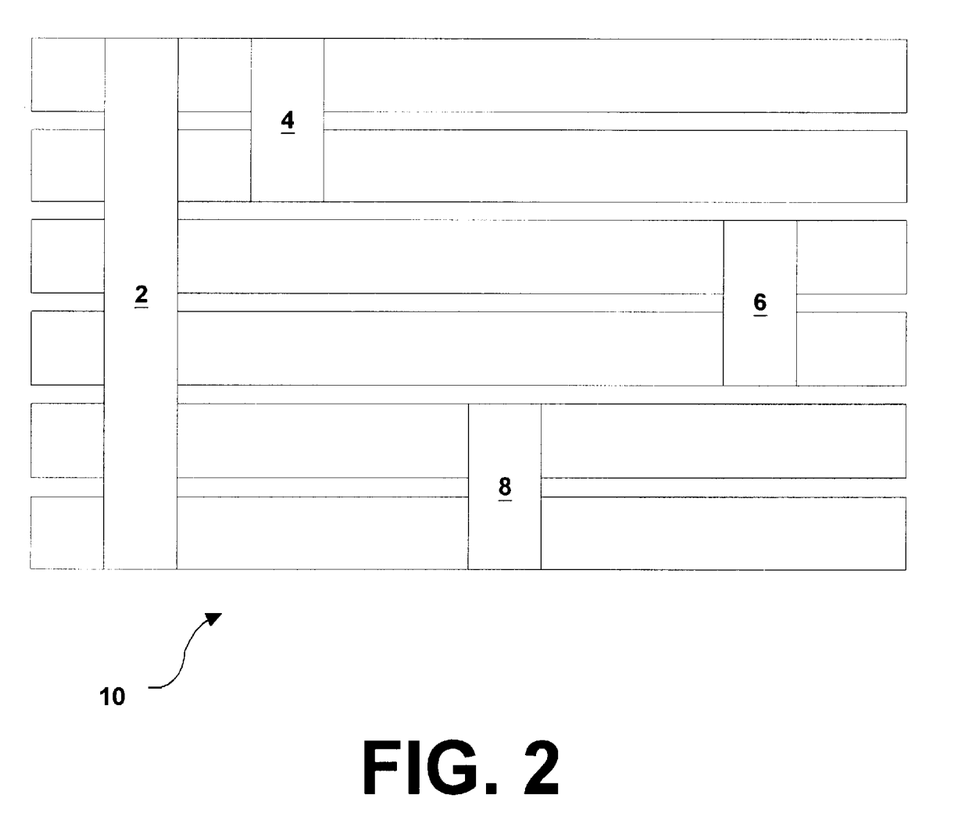
FIG. 2 illustrates the physical location of numerous different via-hole classes within an integrated circuit.

It should be noted that via-holes may be selected from one of several classes. Examples of such classes are, through via-holes, blind top via-holes, buried via-holes, and blind bottom via-holes. FIG. 2 provides an illustration of the physical location of these via-hole classes within an integrated circuit 10 for further clarification. Specifically, a via-hole can be totally buried within a board and can connect adjacent layers in a vertical direction. This type of via-hole is referred to as a buried via-hole 6. The buried via-hole 6 serves the purpose of connecting horizontal signal lines of adjacent layers. A buried via-hole 6 that connects a surface layer to one or more internal layers is referred to as a blind via-hole 4 or 8. A through via-hole extends completely through the thickness of the substrate 2. In addition, it should be noted that thermally conductive via-holes, having no electrical functions, are oftentimes installed under a microchip to remove heat from the chip to the substrate.

Figure 3:
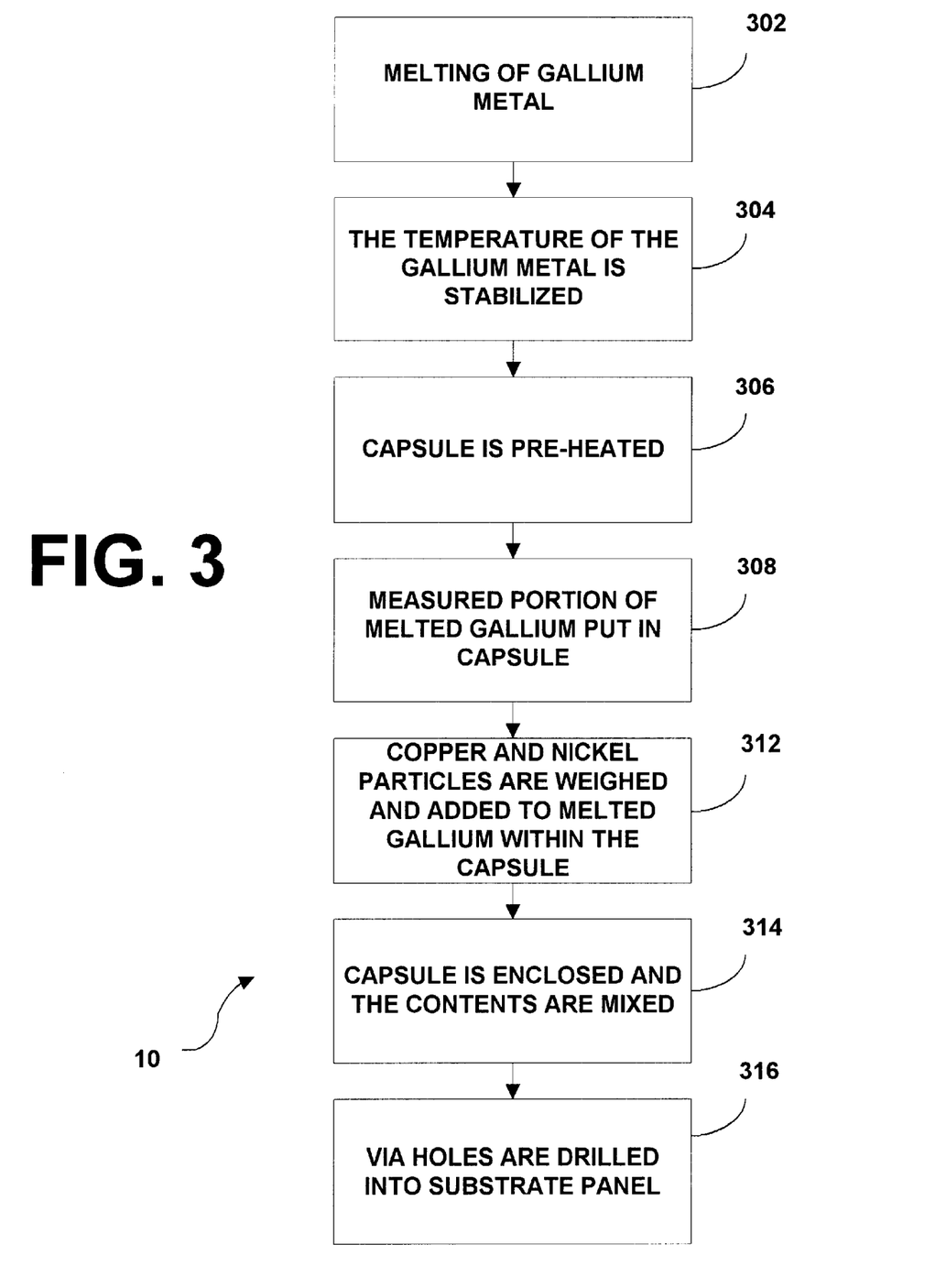
FIG. 3 is a flow chart that illustrates the method of preparing a gallium alloy for filling via-holes, such as the via-holes of FIGS. 1 and 2.

FIG. 3 is a flow chart that illustrates the method of preparing a gallium alloy for filling via-holes, in accordance with the preferred embodiment of the invention. With regard to all flow charts described herein, each block represents a module, segment, or portion of code, which comprises one or more executable instructions for implementing the specified logical function(s). It should also be noted that in some alternate implementations, the functions noted in the blocks may occur out of the order noted. For example, two blocks shown in succession may in fact be executed substantially concurrently, or the blocks may sometimes be executed in the reverse order, depending upon the functionality involved.

As shown by block 302, gallium metal is melted. An example of a process used for melting the gallium metal is placing the metal in a hot plate at approximately 80 degrees Celsius, which is well above its melting temperature of approximately 30 degrees Celsius. The temperature of the gallium metal is then stabilized, preferably to approximately plus, or minus, 2 degrees Celsius (block 304). Stabilization is performed for purposes of preventing solidification of the melted gallium metal. As shown by block 306, a capsule, or any liquid holding device, is pre-heated, preferably to approximately 60 to 70 degrees Celsius for purposes of holding the melted gallium metal for mixing, as is described hereinbelow.

Figure 4:
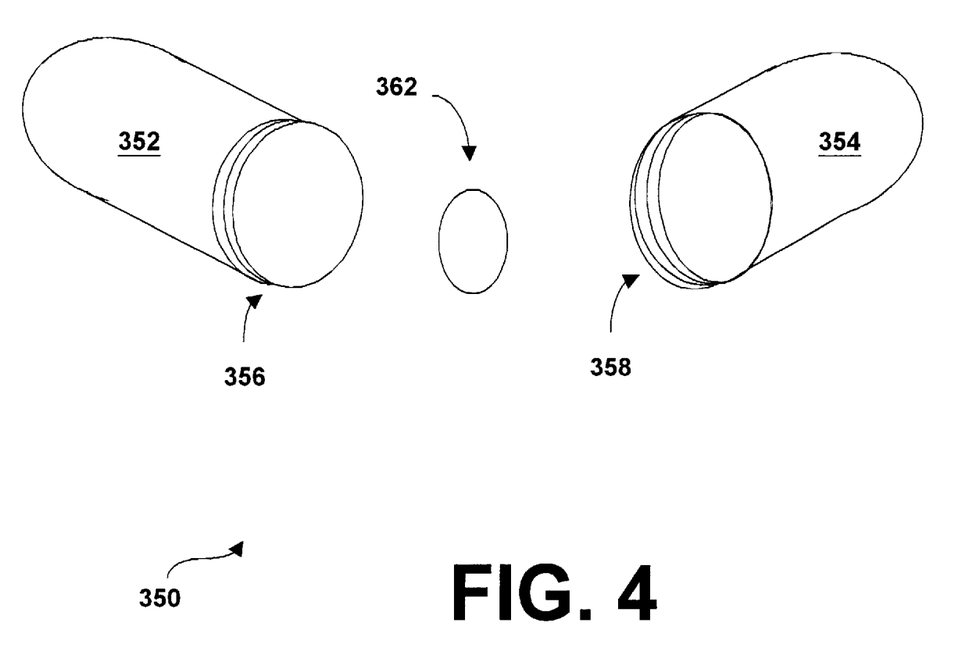
FIG. 4 provides an illustration of a capsule that may be used in accordance with the preferred embodiment of the invention for purposes of holding melted gallium metal for preparation of the gallium alloy of FIG. 3.

FIG. 4 provides an illustration of a typical capsule 350 that may be used in accordance with the preferred embodiment of the invention for purposes of holding the melted gallium metal. As shown by FIG. 4, the capsule 350 comprises a male portion 352 and a female portion 354, wherein the male portion 352 comprises an externally threaded portion 356 and the female portion 354 comprises an internally threaded portion 358. A pestle 362, preferably a Kerr pestle, is provided for insertion within the capsule 350 for purposes of acting as an agitator when mixing the contents of the capsule 350. As known in the art, a pestle may be a metallic cylindrical object, or any otherwise shaped object that will assist in agitation.

It should be noted that the capsule 350 illustrated by FIG. 4 is merely an example of a device that may be used to hold the melted gallium metal for mixing purposes. Alternatively, other holding devices may be used, such as, but not limited to, a conventional screw cap bottle that can sustain impact during mixing, as described below.

Returning to the flow chart of FIG. 3, as shown by block 308, a portion of the melted gallium metal is placed in the capsule 350 (FIG. 4). In accordance with the preferred embodiment of the invention, the portion of gallium metal is approximately 2.6 grams. A VWR adjustable liquid pipette may be used for distributing proper amounts of the liquid gallium to the capsule 350 (FIG. 4). As shown by block 312, copper and nickel particles, which may be in the form of a powder, are then weighed and added into the capsule 350 (FIG. 4) for amalgamation of the liquid gallium. The particles may be accurately weighed by using a Mettler Toledo AB104 balance to an accuracy of approximately 0.0001 grams. Preferably, approximately 1.13 grams of copper and approximately 0.19 grams of nickel are added to the capsule.

Table 1, shown herein below provides a ratio of the amounts of gallium, nickel and copper that are preferred for mechanical alloying. It should be noted that the total amount of gallium, copper and nickel is limited by the size of the capsule used for holding the mixture of liquid gallium, copper and nickel. If the ratio of gallium, nickel, and copper is maintained as shown in Table 1, a larger volume of gallium, copper and nickel will produce similar results.

TABLE 1

Materials composition for gallium alloy

| Metals | Amount | Tolerance | Percentage by weight |
|---|---|---|---|
| Gallium | 2.56 g | ±1% | 65 |
| Copper | 1.13 g | ±0.01 g | 30 |
| Nickel | 0.19 g | ±0.01 g | 5 |

As shown by block 314, the capsule 350 (FIG. 4), containing the liquid gallium, copper and nickel, is enclosed and the contents are mixed. Optionally, the pestle 362 (FIG. 4) is added for agitation purposes. In accordance with the present example, the male portion 356 (FIG. 4) of the capsule 350 (FIG. 4) is preferably wrapped with a Teflon tape prior to enclosing of the capsule 350 (FIG. 4) for purposes of preventing gallium leakage during mixing. The male portion 356 and female portion 358 of the capsule 350 (FIG. 4) are then screwed together tightly in order to enclose the capsule 350 (FIG. 4). An example of a method that may be used for mixing the contents of the capsule 350 (FIG. 4) is placing the enclosed capsule 350 (FIG. 4) in a Kerr Automix. The Automix may be run at approximately 3000 cpm for approximately 30 seconds, followed by approximately 30 seconds dwell, and finally approximately 30 seconds at 3900 cpm. After this high speed mixing, the mixture of gallium, nickel and copper (herein after "the mixture") is ready for being used to print, as described in detail herein below. As known in the art, printing comprises, among other procedure, filling via-holes and creating interconnects using methods, such as, stencil guidance.

Figure 5:
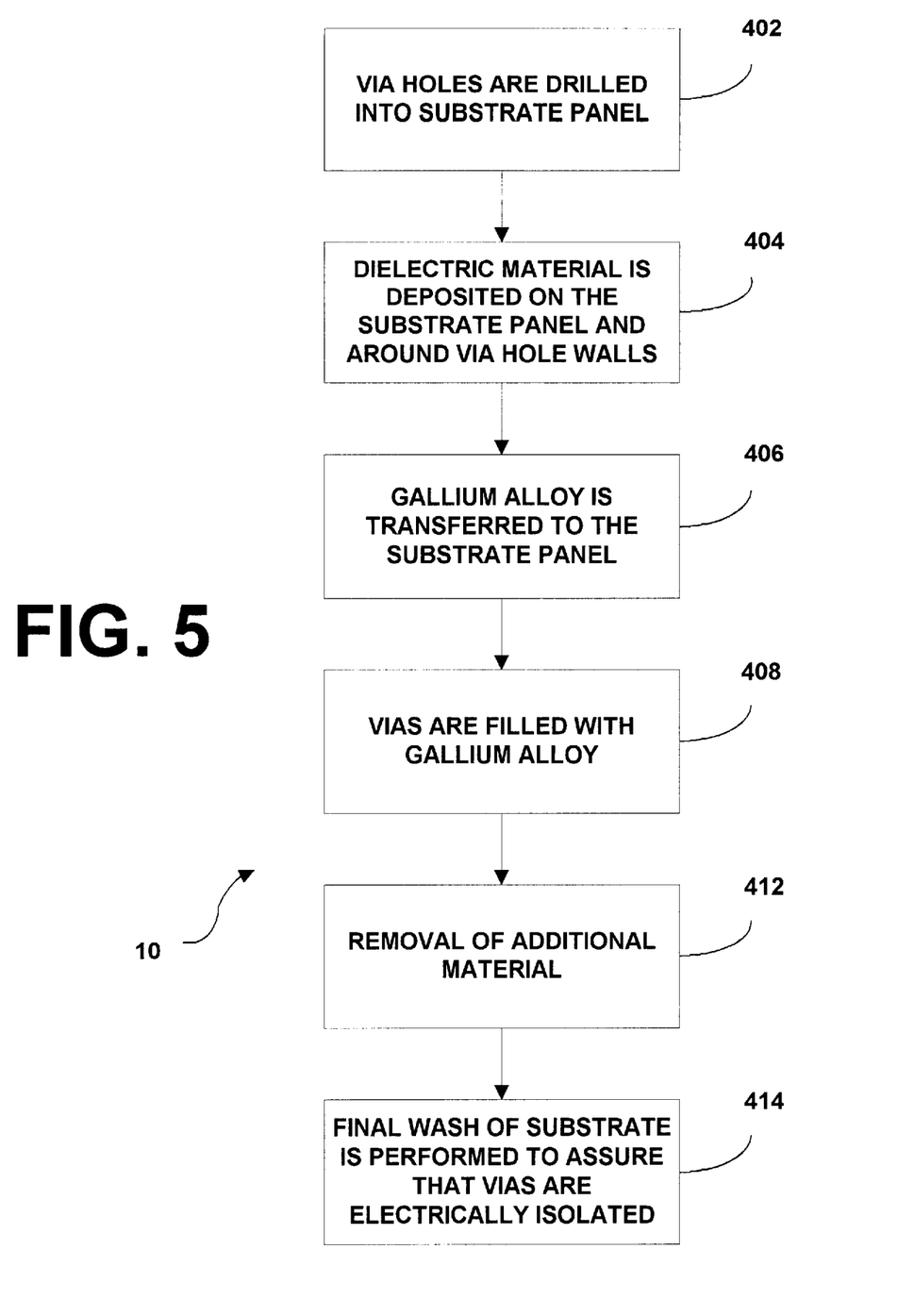
FIG. 5, is a flow chart that illustrates substrate and via-hole preparation to provide for microelectronic interconnects.

FIG. 5, is a flow chart that illustrates substrate and via-hole preparation to provide for the microelectronic interconnects, in accordance with the preferred embodiment of the invention. As shown by block 402, via-holes are drilled into a stainless steel substrate panel. Preferably, the via-holes are laser drilled. In accordance with the preferred embodiment of the invention, stainless steel has been selected as the substrate material due to its offering of numerous advantages over traditional electronic materials because of its superior strength-to-weight ratio, flexibility, corrosion resistance, cost, and aesthetic appearance. Some of these key advantages can be utilized for its application as a niche substrate material for multi-chip module—deposited (MCM-D) packaging, especially when substrate flexibility is desired. One of the key issues for the use of stainless steel as a substrate material is the level of warpage it experiences during and after thin-film processing. A detailed discussion of warpage with reference to stainless steel as a substrate material is provided herein below.

It should be noted, however, that materials other than stainless steel may be used as the substrate in accordance with the present system and method. The present via filling process and materials described may be applied to substrate materials such as, but not limited to, metals, ceramics, polymers, and composites.

The stainless steel substrate panel is preferably pre-heated to approximately 100 degrees Celsius. In accordance with the preferred embodiment of the invention, the substrate is pre-heated to assist in the deposition of dielectric by a vapor deposition process, as explained below. As shown by block 404, a dielectric material is then deposited on the stainless steel panel and around the inside via-hole walls in order to electrically isolate the via-hole filling material from the body of the stainless steel substrate. It should be noted that the dielectric material of FIG. 5 is the same physical layer as the barrier layer 18 of FIG. 1. The dielectric material deposition also makes the stainless steel panel surface non-conductive so as not to interfere with later installed interconnects. Deposition of the dielectric material may be performed via methods such as, but not limited to, vapor deposition, spin coating, or meniscus coating.

An example of a dielectric material that may be used in accordance with the preferred embodiment of the invention is Parylene N, made by Specialty Coating Systems. As known in the art, the use of material such as Parylene N prevents fabrication problems such as, but not limited to, pinholes, edging, bridging and gapping, thermal or mechanical stress, particle instability, and voids. In accordance with an alternate embodiment of the invention, both sides of the substrate may be coated by the dielectric material, thereby reducing the warpage of the flexible substrates in their initial state and also during subsequent high temperature processes. It should be noted that the dielectric material is not intended to be limited to polymers as described herein. Other insulating materials may include, but are not limited to, silicon dioxide or silicon nitride.

Gallium alloys are mechanically alloyed mixtures of a liquid metal and metallic powders, formed at room temperature. A significant advantage of gallium alloys is that liquid gallium can wet most metallic and oxide surfaces found in microelectronic applications and can inherently form electrical contact. Further, bulk gallium alloy materials are mechanically stronger than standard solder alloys. In general, gallium alloys can be thought of as "metallic adhesives" since these alloys can be processed similar to organic adhesives. However, upon curing they have electrical and thermal properties comparable to solder, making them ideal for interconnect materials. As an added benefit, the gallium alloy expands with time of curing, as opposed to shrinking, which is a characteristic of other via-hole fillers such as solder and polymer-based paints.

As shown by block 406, the mixture, or gallium alloy, is then transferred to the substrate panel in preparation for via-hole filling. Via-hole filling is then performed by filling via-holes with the gallium alloy (block 408). Via-hole filling may be performed via use of a rubber squeeze. After via-hole filling has been completed, additional material is removed from the substrate (block 412). One example of a method that may be used to remove the excess gallium alloy is the use of a rubber squeegee. As shown by block 414, a final wash of the substrate panel is then performed to assure that the via-holes are electrically isolated. Preferably, the final cleaning is performed by using a warm 10% HCL solution in deionized water, after which the surface of the substrate is wiped off.

The substrate, having the gallium alloy filled via-holes therein, is then cured (block 346). Preferably, curing is performed at approximately 130 degrees Celsius for approximately sixteen hours using a convection oven. It should be noted, however, that the gallium alloy may be cured at a wide temperature range varying from room temperature to 200 degrees Celcius, thus the alloy is applicable to a wide variety of microelectronic processes and substrates such as those compatible with multi-chip module-laminate (MCM-L) and multi-chip module-deposited (MCM-D). The heating and cooling rates are maintained approximately 5 degrees Celsius per minute. After cooling to below approximately 70 degrees Celsius, the substrate, having the gallium alloy therein, is removed from the oven to prevent cracking of the dielectric coating.

As explained herein above, warpage is a major concern in relation to substrate usage. Warpage in the board level can lead to component mis-registration during automated component placement and insertion processes. Many methods of measuring warpage exist. The Shadow Moire technique is used for measuring thermally induced warpage. This technique demonstrates the desirable qualities of using stainless steel as the substrate in accordance with the preferred embodiment of the invention. This non-contact, full field measurement method generates a Moire pattern, which is a fringe pattern that represents a "contour map" of the surface of the stainless steel.

Figure 6:
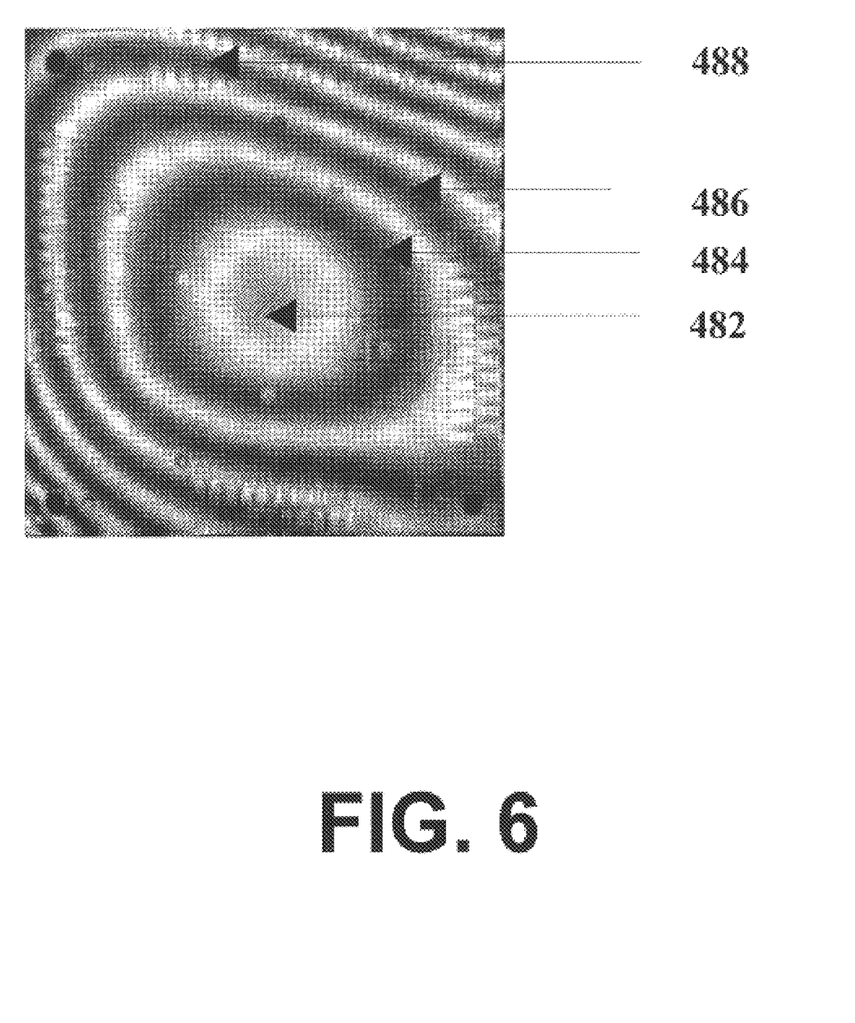
FIG. 6 is an example of a Moire fringe pattern derived in measuring substrate warpage within an integrated circuit, such as the integrated circuit of FIG. 1.
Figure 7:
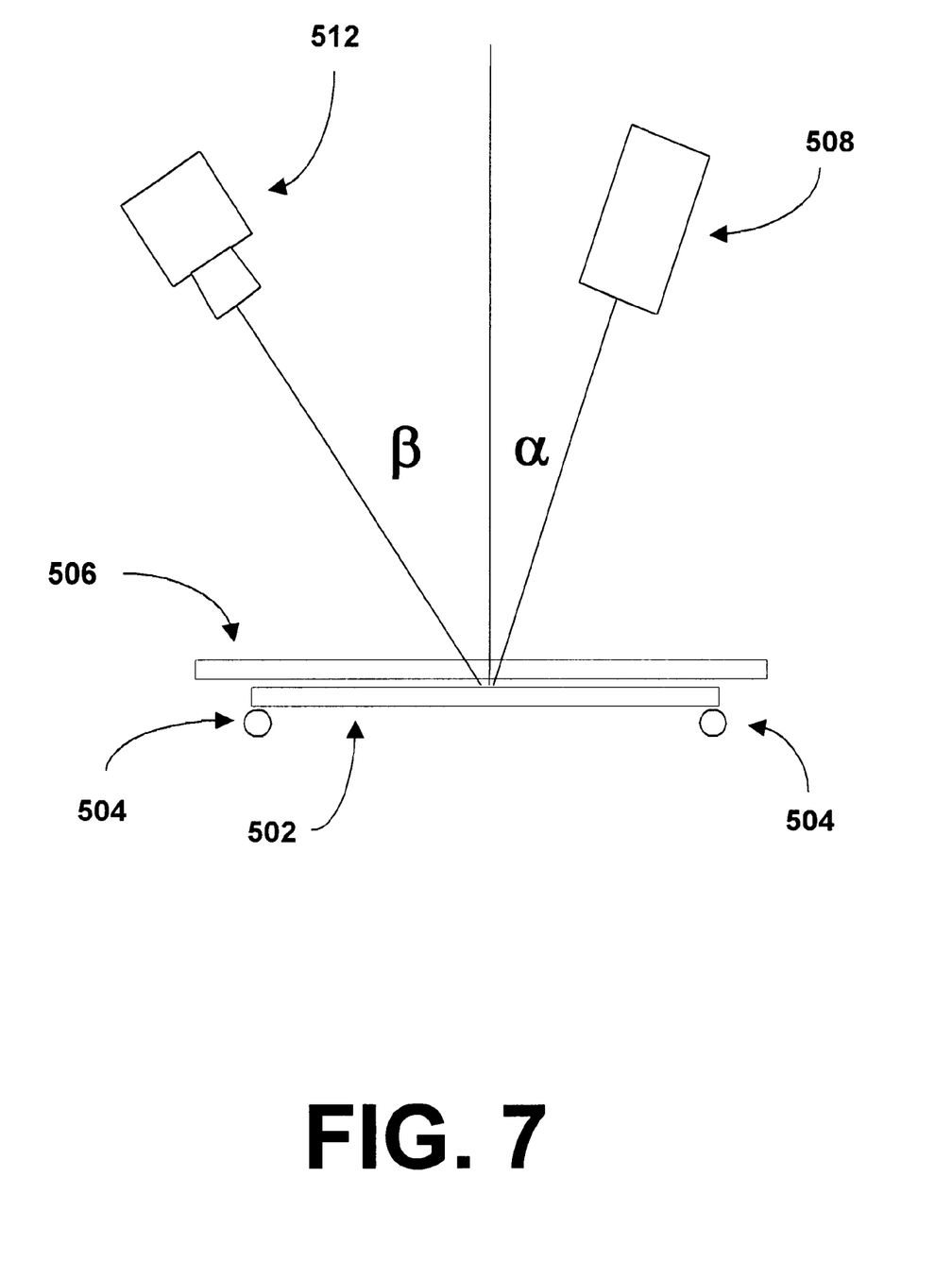
FIG. 7 illustrates a system that may be used for testing the warpage characteristics of a substrate, thereby obtaining the Moire fringe pattern of FIG. 6.

FIG. 6 represents an example of a Moire fringe pattern. As shown by FIG. 6, the Moire pattern is a visual pattern of light and dark regions produced by the superposition of two regular motifs that geometrically interfere. A Moire pattern appears when warpage, or surface curvature, is present. A number of fringes are illustrated by FIG. 6 which are produced by the interference of reflected light, as illustrated in FIG. 7. Change in surface height between any two adjacent fringes is given as the reciprocal of grating density. Observed patterns are accurately translated into specimen out-of-plane displacement through mathematical computer analysis. The following provides an example of how warpage characteristics of stainless steel may be tested, thereby confirming the beneficial characteristics of using stainless steel as a substrate.

FIG. 7 illustrates a system that may be used for testing the warpage characteristics of a substrate, such as, but not limited to, stainless steel. Set up for testing warpage of the stainless steel specimen 502 begins by horizontally supporting the specimen 502. Support of the specimen 502 may be provided with, for example, a support rail 504. A reference grating 506, or Ronchi Ruling, is suspended directly above the specimen 502. The reference grating 506 is preferably a flat, thin glass such that equally spaced parallel solid lines are etched into one side. A light source 508 is directed onto the specimen 502 through the reference grating 506 at angle α as the Moiré pattern is observed by a camera 512 at angle β. The out-of-plane displacement relationship is given as:

$$\omega = (Np)/(\tan \alpha + \tan \beta) \qquad (1)$$

Where:
  α=angle of the light source with respect to the normal of the test specimen
  β=angle of the camera with respect to the normal of the test specimen
  N=fringe order or fringe count at the corresponding point
  P=grating line pitch
  ω=out-of-plane displacement in inches at the Nth fringe order Warpage measurement resolution is a direct function of reference grating line spacing or density (given as lines-perinch, lpi), where larger lpi yields finer resolution. A grating shadow, which distorts in the presence of surface warpage, is produced on the specimen 502 when a collimated light source 508 is directed through the reference grating 506. Thus, a perfectly flat specimen parallel to the plane of the grating 506 will not yield a Moiré pattern. A Moiré pattern appears when surface curvature (warpage) is present. Change in surface height between any two adjacent fringes is given as the reciprocal of the grating density. Observed patterns are preferably translated into specimen out-of-plane displacement through mathematical computer analysis.

One precise method of using Moiré fringe patterns for displacement measurement is known as the phase-stepping technique. When the change in distance between the grating 506 and specimen 502 is a whole multiple of the grating resolution, a fringe pattern "repeats" itself, and has shifted one complete fringe. Phase stepping involves analyzing several fringe patterns, produced when the grating 506 is translated a fraction of the resolution height. This process significantly improves measurement sensitivity and inherently describes warpage direction.

It should be noted that warpage can be measured by a wide variety of other techniques. Such techniques may include, but are not limited to, indicator gauge, shims, Twyman Green, laser profilometry, and holography. It should also be noted that the gallium alloy may be used for thin film process on related multi-chip module-laminate (MCM-L) substrates, as well as MCM-D substrates.

In accordance with an alternate embodiment of the invention, the vias filled with gallium alloy can be plated with copper in an electroless plating bath. This can be employed to planarize the via surface in order to avoid mis-registration of vias when the via-filled substrates are used in the multi-layer build-up process. The parylene coating remains unaffected by the chemicals in the plating bath.

In summary, the combined usage of a gallium-based metallic alloy for filling via-holes, and for printing interconnect lines on board surfaces, with the use of stainless steel as a substrate, provides an ideal microelectronic circuit platform that comprises minimal warping and better yields of through hole interconnections for multi-chip module substrates.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A method of providing via-hole fills for microelectronic interconnections, comprising the steps of:

melting a portion of gallium metal;

mixing said melted gallium metal with a portion of nickel and a portion of copper to amalgamize said melted gallium metal, thereby creating a gallium alloy;

drilling at least one via-hole within a stainless steel substrate;

depositing a dielectric material on said substrate, including inside said via-hole;

transferring said gallium alloy to said substrate to prepare for filling said via-hole;

filling said via hole with said gallium alloy; and curing said substrate, having said gallium alloy filled via-hole therein.

2. The method of claim 1, wherein said portion of gallium metal is approximately 2.6 grams, said portion of copper is approximately 1.13 grams, and said portion of nickel is approximately 0.19 grams.

3. The method of claim 1, wherein said portion of copper and said portion of nickel is a powder.

4. The method of claim 1, wherein said via-hole is laser drilled to approximately 0.01 inches in depth.

5. The method of claim 1, further comprising the step of plating said filled via-hole with copper in an electroless plating solution.

6. The method of claim 1, further comprising the step of washing said substrate to assure that via-holes are electrically isolated.

7. The method of claim 6, wherein said step of washing is performed by using a warm 10% HCL solution in deionized water.

8. The method of claim 1, wherein said curing step is performed at approximately 130 degrees Celsius for approximately sixteen hours within a convection oven.

9. The method of claim 1, wherein said curing step is performed within the temperature range of room temperature to approximately 200 degrees Celsius.

10. The method of claim 1, further comprising the step of printing interconnect lines with said gallium alloy.

* * * * *

UNITED STATES PATENT AND TRADEMARK OFFICE
CERTIFICATE OF CORRECTION

PATENT NO.    : 6,554,923 B2                                                            Page 1 of 1
DATED         : April 29, 2003
INVENTOR(S)   : Bhattacharya et al.

It is certified that error appears in the above-identified patent and that said Letters Patent is hereby corrected as shown below:

<u>Title page,</u>
Item [60], Related U.S. Application Data, after the date "February 15," delete the date "2001", and substitute therefor -- 2000 --.

Signed and Sealed this

Twenty-sixth Day of August, 2003

JAMES E. ROGAN
*Director of the United States Patent and Trademark Office*